United States Patent [19]
Phillips et al.

[11] Patent Number: 5,500,302
[45] Date of Patent: Mar. 19, 1996

[54] BARRIER FILM AND METHOD

[75] Inventors: Roger W. Phillips; Paul G. Coombs; Lauren R. Wendt, all of Santa Rosa, Calif.

[73] Assignee: Flex Products, Inc., Santa Rosa, Calif.

[21] Appl. No.: 234,471

[22] Filed: Apr. 26, 1994

Related U.S. Application Data

[63] Continuation-in-part of Ser. No. 34,728, Mar. 22, 1993, abandoned, which is a continuation-in-part of Ser. No. 818,399, Jan. 2, 1992, abandoned, which is a continuation of Ser. No. 343,900, Apr. 26, 1989, abandoned.

[30] Foreign Application Priority Data

| Apr. 24, 1990 | [CA] | Canada | 2015308 |
| Apr. 25, 1990 | [JP] | Japan | 2-109936 |
| Apr. 26, 1990 | [EP] | European Pat. Off. | 90304533 |

[51] Int. Cl.$^6$ .................................................. B32B 27/08
[52] U.S. Cl. .................. 428/474.4; 428/216; 428/408; 428/480; 428/926
[58] Field of Search ................... 428/408, 474.4, 428/480, 926, 216

[56] References Cited

U.S. PATENT DOCUMENTS

| 4,173,522 | 11/1979 | Pulker et al. | 204/192 |
| 4,702,963 | 10/1987 | Phillips et al. | 428/426 |
| 4,756,964 | 8/1988 | Kincaid et al. | 428/428 |
| 4,913,762 | 4/1990 | Kittler | 156/272.6 |
| 5,198,063 | 3/1993 | Howard et al. | 428/408 |
| 5,276,537 | 1/1994 | Savant et al. | 428/408 |

FOREIGN PATENT DOCUMENTS

| 130754 | 1/1985 | European Pat. Off. |
| WO88/08043 | 10/1988 | WIPO |

*Primary Examiner*—John C. Bleutge
*Assistant Examiner*—Amy Hulina
*Attorney, Agent, or Firm*—Flehr, Hohbach, Test, Albritton & Herbert

[57] ABSTRACT

A barrier film comprising a flexible substantially of transparent substrate having first and second surfaces. A substantially colorless barrier coating is formed on at least one of said surfaces of a graphite material having a thickness ranging from 50 to 350 Å.

9 Claims, 1 Drawing Sheet

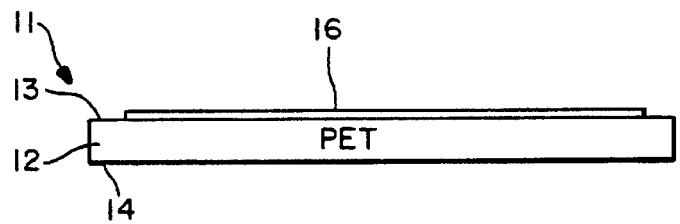
FIG.—1
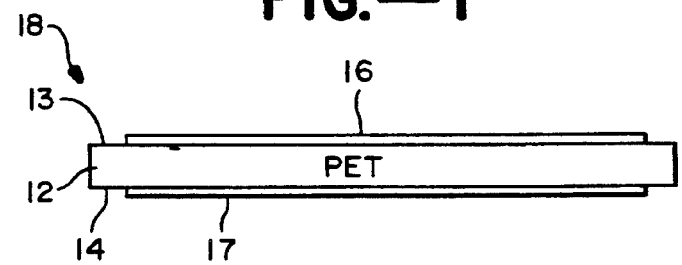
FIG.—2
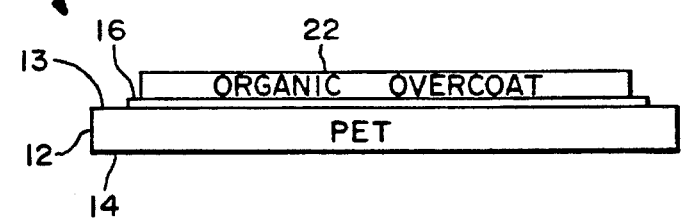
FIG.—3
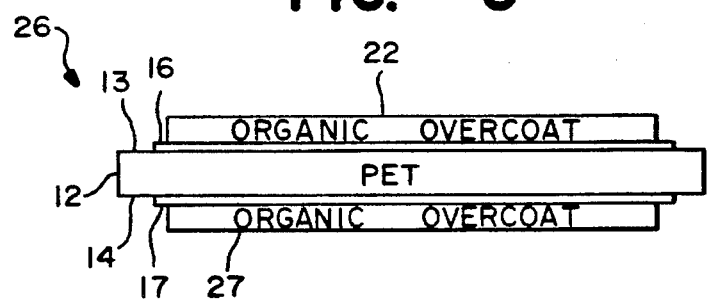
FIG.—4
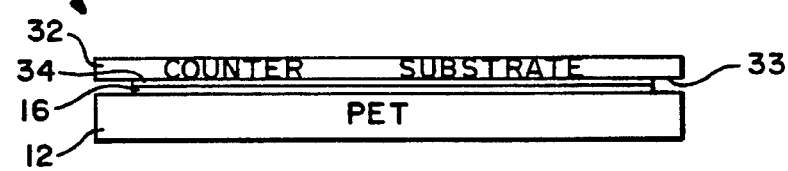
FIG.—5
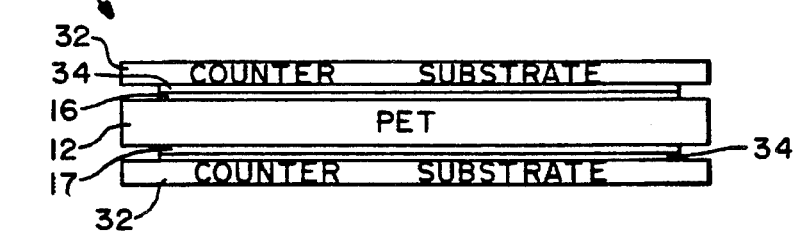
FIG.—6

BARRIER FILM AND METHOD

This application is a continuation-in-part application Ser. No. 08/034,728 filed Mar. 22, 1993 now abandoned, which is a continuation in part of application Ser. No. 07/818,399 filed on Jan. 2, 1992 now abandoned which is a continuation of application Ser. No. 07/343,900 filed on Apr. 26, 1989 now abandoned.

This invention relates to a water vapor and oxygen barrier film and more particularly to a colorless flexible plastic film which is provided with a barrier coating formed of a graphite material that substantially reduces the Water Vapor Transmission Rate (WVTR) and Oxygen Transmission Rate Barrier films have heretofore been provided as in U.S. Pat. No. 4,702,963 which has many desirable characteristics. However, the film in Pat. No. 4,702,963 has one inherent characteristic which is undesirable in certain applications because it has an amber color. In certain situations it is desirable to ascertain when a product changes color as, for example, turns yellow. This is difficult to ascertain in an amber-colored film. In U.S. Pat. No. 4,557,946, there are disclosed organosilicone films in which the protective film is provided by utilizing a plasma polymerized organosilicone material having an inorganic component. These plasma deposited films had to be deposited onto heated substrates (approximately 180° C.) in order to achieve adequate adhesion and impermeability. In an article entitled "Variable Angle Spectroscopic Ellipsometry" by Alterovitz et al. published in *Solid State Technology* for March, 1988 there is a disclosure of ellipsometric experiments which were carried out which included the analysis of moisture penetration of dielectrics. One insulator studied was a plasma deposited semitransparent amorphous carbon film on a silicon substrate. The article pointed out than analysis showed that even after immersion for several hours, hot water did not penetrate any carbon film 250 Angstroms or thicker. This article did not address gaseous water permeation, only aqueous water permeation. Furthermore none of the published information discloses or suggests how the need for a substantially colorless transparent barrier film could be made. There is therefore a need for a new and improved and substantially colorless transparent barrier film.

In general, it is an object of the invention to provide a substantially colorless barrier film.

Another object of the invention is to provide a barrier film of the above character which has excellent mechanical properties.

Another object of the invention is to provide a barrier film of the above character which readily meets the medical requirements for barrier films with respect to penetration of oxygen and moisture.

Another object of the invention is to provide a barrier film of the above character which provides good overall visual transmission.

Additional objects and features of the invention will appear from the following description in which the preferred embodiments are set forth in detail in conjunction with the accompanying drawings.

FIG. 1 is a cross-sectional view of a barrier film incorporating the present invention in which a barrier coating is utilized on only one side of the substrate.

FIG. 2 is a cross-sectional view of a barrier film incorporating the present invention in which a barrier coating is provided on both sides of the substrate.

FIG. 3 is a cross-sectional view similar to FIG. 1, but showing the use of an organic overcoat on the barrier coating.

FIG. 4 is a cross-sectional view of a barrier film of the type shown in FIG. 2 with an organic overcoat provided on the barrier coatings on both sides of the substrate.

FIG. 5 is a cross-sectional view of a barrier film of the type shown in FIG. 1 in a laminated structure.

FIG. 6 is a cross-sectional view of a barrier film of the type shown in FIG. 2 in a laminated structure.

In general, it is an object of the present invention to provide a barrier film which is comprised of a flexible substantially transparent substrate having first and second surfaces. A barrier coating is formed-on at least one of the surfaces of the substrate and is formed of a graphite material having a thickness ranging from 50 to 300 Angstroms. In the method, the graphite material is deposited by use of an electron beam or by sputtering using multiple cathodes. Although sputtering yields of graphite is low, the thin coatings of graphite required and the use of multi-cathodes offset these limitations.

As shown in FIG. 1 of the drawings, the barrier film 11 is comprised of a flexible substrate 12 formed of a suitable plastic such as a polymer. A polyester such as polyethylene terephthalate (PET) can be utilized having a thickness ranging from 1 to 7 mils. The substrate is provided with firsthand second surfaces 13 and 14. The substrate in accordance with the present invention should be transparent or substantially transparent to visible light. A barrier coating 16 is formed on at least one surface, as for example, the surface 13 shown in FIG. 1. The barrier coating 16 in accordance with the present invention is formed of a graphite material substantially free of hydrogen deposited to a thickness ranging from 50 Angstroms to 300 Angstroms depending upon the water vapor transmission rate (WVTR) and the oxygen transmission rate (OTR) requirements desired. Higher thicknesses can be used, but at thicknesses above 300 Angstroms, the optical transmittance of the barrier film plus substrate is reduced to below 30% and is thus not considered as being substantially transparent to visible light. Thus the same materials may be used to produce an opaque barrier film where the thickness of the barrier coating less the substrate would range from 300 to 1000 Angstroms.

The barrier coating of the graphite- material is preferably deposited utilizing an electron gun to evaporate the graphite starting material in a conventional vacuum chamber. The graphite barrier coating 16 can be deposited in a single pass or, if desired, in multiple passes so that the total thickness is the same as for the single pass. Even though the graphite material is generally a very opaque material, it has been found that at the thickness of 50 to 300 Angstroms it still can provide good transmission characteristics at the barrier levels desired. Although the graphite barrier coating has a color, in the thickness utilized for the barrier coating, the color is relatively neutral or a very light gray which becomes slightly darker at greater thicknesses of up to 300 Angstroms.

It has been found that the graphite barrier coating has good adhesion. Utilizing a conventional 3M tape adhesive pull-off test (see MIL-C-675A) the barrier coating will pass that test. The graphite barrier coating also passes the cheese cloth test by withstanding from 60 to 120 cheesecloth rubs before any scratches appear in the coating. The graphite barrier coating does not crack or flake off when the flexible plastic substrate 12 is creased or flexed.

The thin film shown in FIG. 1 has been tested for its permeability to oxygen and water. It readily passes medical specifications for oxygen and water permeability for packaging films. By way of example, it has been found that a substrate 12 formed of a 2 mil PET provided a 55% overall visual transmission and a WVTR of 0.02 grams per 100 square inches per 24 hour period at 100° F. and at 90% relative humidity and an OTR of 0.04 cubic centimeters per 100 square inches per day at 74° F. at one atmosphere and a relative humidity of 0%. In comparison a 2 mil uncoated polyester has a WVTR and OTR of 0.56 to 0.63 grams per 100 square inches per day and 1.97 cc per 100 square inches per day.

When additional impermeability is required, an additional barrier coating 17 can be provided on the surface 14 on the other side of the substrate 12 as shown in FIG. 2 which can be formed of the same material to the same thickness as the barrier coating 16. Thus there is provided in a barrier film 18 which has approximately twice the moisture and oxygen impermeable characteristics of the barrier film 11 shown in FIG. 1 with only one barrier coating. The barrier film 18 because of the two barrier coatings 16 and 17 has a reduced optical transmission compared to the transmission of the barrier film 11 shown in FIG. 1.

In order to achieve still further improved characteristics for the barrier film a barrier film 21 is shown in FIG. 3 in which an organic overcoat 22 is deposited on the barrier film 21. The organic overcoat substantially increases the impermeability of the barrier coating 16 even though the organic overcoat in and of itself had very little, if any, effect on the vapor barrier characteristics of the plastic substrate 12. Various types of organic coatings can be provided. For example, Emerez 1533 polyamide manufactured by Emery Industries was mixed in a common solvent, tetrahydrofuran (THF) at a ratio of 25% to 75% by weight respectively. Another organic coating was formed by taking 25% of the Emerez 1533 solution and combining it with 1,6-diisocyanatohexane (HDI, a cross-linker) and a 1% polymethyl trifluoropropylsiloxane (Petrarch, PS 181) in THF solution at a ratio of 96.4%, 1.5%, 2.1%, respectively by weight. Another organic coating contained 95.7% of the 25% E1533, 1.9% toluene diisocyanate (TDI) and 2.4% of the 1% PS 181. Optimum results were achieved using an organic overcoat in the form of a polyamide coating without the use of cross-tinkers or special solvents because it was found that their additions did not significantly affect the characteristics of the organic overcoat.

These organic coatings were applied in a wet layer of 0.005 inches thick to provide a final coating of 0.0009 inches to 0.0010 inches thick after evaporation of the THF. The samples containing HDI and TDI were baked at 100° C. for 30 minutes to activate the cross-linker.

The placement of the graphite barrier coating on the plastic film achieved a reduction in WVTR of more than 90%. The WVTR was further reduced by another 50 to 60% by the application of the organic overcoating hereinbefore described.

When still further improved capability is desired, a graphite barrier film 26 of the type shown in FIG. 4 can be provided with an additional organic overcoat 27 provided on the second barrier coating 17 so that there is provided a graphite barrier coating on both surfaces of the flexible substrate as well as an organic overcoat on both graphite barrier coatings.

In FIG. 5 there is shown another embodiment of the present invention in which the graphite barrier film is utilized in a laminated structure 31. The structure 31, as shown in FIG. 5, is comprised of the substrate 12 and the graphite layer 16 hereinbefore described. A flexible plastic layer 32 is provided formed of a suitable laminating film, as for example, polypropylene, polyester or other heat sealable film. One surface 33 of the layer 32 is coated with a suitable laminate adhesive 34. The counter substrate 32 with the adhesives 34 can then be secured to the barrier film comprised of the substrate 12 and the graphite layer 16 to provide the composite structure 31 which has the excellent barrier characteristics hereinbefore described and which also can be heat sealed to itself. This makes it possible to utilize the layered or laminated structure 31 shown in FIG. 5 for making self-contained bags which can be sealed on themselves by the use of heat. For example, polypropylene can be sealed on itself. Thus, a bag can be made with such a material which could be filled with a liquid. In such an orientation, the liquid would face the polyester, or alternatively, if desired the polypropylene or the polyethylene could face the liquid. The main criteria are that the graphite layer is covered and that the heat sealable material face inwardly so that the bag can be self-sealed by the application of heat.

Another embodiment of the invention is shown in FIG. 6 in which another laminated structure 36 is shown utilizing a graphite barrier film of the present invention in which an additional flexible plastic layer is laminated to both sides of the barrier film 18 shown in FIG. 2. A laminating layer 32 of the type hereinbefore described provided with a laminate adhesive 34 so that, for example, heat sealable plastic layers can be provided on both sides of the graphite barrier film 18 as shown in FIG. 2. In this way, it is possible to provide a structure which permits heat sealing on either side so that bags can be formed by folding the laminated structure 36 so that either side can be folded inwardly onto itself or to the other surface and sealed.

From the foregoing it can be seen that there has been provided a flexible graphite barrier film which has excellent water vapor and oxygen impermeability characteristics and which has a neutral or light gray color. The visual transmission preferably can vary from 30 to 70%. The graphite barrier film of the present invention has achieved adequate adhesion and low levels of impermeability where the barrier film has been deposited on substrates at room temperature. Calculations show that the graphite barrier coating described herein is inherently a better barrier against water vapor than the coating described in U.S. Pat. No. 4,557,946. The permeability constant for the present film is calculated to be approximately $10^{-13}$ cc cm/cm$^2$ sec. cm Hg vs $10^{-9}$ cc cm/cm$^2$ sec. cm Hg for the coating disclosed in U.S. Pat. No. 4,557,946. Thus, the graphite coating herein reported has four orders of magnitude lower permeability constant.

What is claimed is:

1. A barrier film having low oxygen and water permeability for use on a flexible plastic substrate comprising a flexible substantially transparent plastic substrate having first and second surfaces, a substantially colorless barrier coating formed on at least one of said surfaces and being formed solely of graphite having a thickness ranging from 50 to 300 Å, said barrier film having a reduced water transmission rate and a reduced oxygen transmission rate with respect to the uncoated substrate and having a visible transparency of 30% or greater and an additional substantially colorless barrier coating substantially identical to the first named barrier coating formed on the other of said first and second surfaces.

2. A barrier film having low oxygen and water permeability for use on a flexible plastic substrate comprising a flexible substantially transparent plastic substrate having first and second surfaces, a substantially colorless barrier coating formed on at least one of said surfaces and being formed solely of graphite having a thickness ranging from 50 to 300 Å, said barrier film having a reduced water transmission rate and a reduced oxygen transmission rate with respect to the uncoated substrate and having a visible transparency of 30% or greater, an additional substantially colorless barrier coating substantially identical to the first named barrier coating formed on the other of said first and second surfaces and an organic overcoat overlying each of said first named and additional barrier coatings.

3. A barrier film having low oxygen and water permeability for use on a flexible plastic substrate comprising a flexible substantially transparent plastic substrate having first and second surfaces, and having a thickness ranging from 1 to 7 mils, a substantially colorless barrier coating formed on at least one of said surfaces and being formed solely of graphite free of hydrogen having a thickness ranging from 50 to 300 Å, said barrier film having a reduced water transmission rate and a reduced oxygen transmission rate with respect to the uncoated substrate and having a visible transparency of 30% or greater, and an organic overcoat overlying the barrier coating, the organic overcoat consisting essentially of a polylmide.

4. A barrier film as in claim 1, together with a layer of flexible plastic material laminated to said barrier coating.

5. A barrier film as in claim 4, wherein said plastic material is formed of a material that can be sealed onto itself.

6. A barrier film as in claim 5 wherein said plastic material is of a type that can be sealed onto itself by the use of heat.

7. A barrier film having low oxygen and water permeability for use on a flexible plastic substrate comprising a flexible substantially transparent plastic substrate having first and second surfaces, a substantially colorless barrier coating formed on at least one of said surfaces and being formed solely of graphite having a thickness ranging from 50 to 300 Å, said barrier film having a reduced water transmission rate and a reduced oxygen transmission rate with respect to the uncoated substrate and having a visible transparency of 30% or greater, an additional substantially colorless barrier coating substantially identical to the first named barrier coating formed on the other of said first and second surfaces and a flexible layer of plastic material laminated to each of said first named and additional barrier coatings.

8. A barrier film as in claim 7, together with an adhesive disposed between the layer of plastic material and the first named and additional barrier coating.

9. A barrier film as in claim 8 wherein said plastic layer is formed of a plastic material which can be sealed onto itself.

* * * * *

UNITED STATES PATENT AND TRADEMARK OFFICE
CERTIFICATE OF CORRECTION

PATENT NO. : 5,500,302
DATED : March 19, 1996
INVENTOR(S) : Phillips et al.

It is certified that error appears in the above-indentified patent and that said Letters Patent is hereby corrected as shown below:

column 4, line 35:

change "impermeability" to --permeability--

Signed and Sealed this

Fifth Day of August, 1997

*Attest:*

BRUCE LEHMAN

*Attesting Officer*      *Commissioner of Patents and Trademarks*